United States Patent
Wu et al.

(10) Patent No.: US 11,189,607 B2
(45) Date of Patent: Nov. 30, 2021

(54) TRANSPARENT MICRO LED DISPLAY PANEL

(71) Applicant: HON HAI PRECISION INDUSTRY CO., LTD., New Taipei (TW)

(72) Inventors: I-Wei Wu, New Taipei (TW); I-Min Lu, New Taipei (TW); Loganathan Murugan, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 145 days.

(21) Appl. No.: 16/421,848

(22) Filed: May 24, 2019

(65) Prior Publication Data

US 2019/0363127 A1 Nov. 28, 2019

Related U.S. Application Data

(60) Provisional application No. 62/677,070, filed on May 28, 2018.

(51) Int. Cl.
*H01L 25/16* (2006.01)

(52) U.S. Cl.
CPC .................... *H01L 25/167* (2013.01)

(58) Field of Classification Search
CPC ................. H01L 33/44; H01L 25/167; H01L 27/153–156
See application file for complete search history.

(56) References Cited

U.S. PATENT DOCUMENTS

| 9,478,583 | B2* | 10/2016 | Hu ........................ H01L 33/62 |
| 9,966,553 | B2* | 5/2018 | Choi ................... H01L 51/5218 |
| 10,540,046 | B2* | 1/2020 | Lai ........................ G06F 3/0446 |
| 2012/0256216 | A1 | 10/2012 | Weng |
| 2016/0163765 | A1 | 6/2016 | Hu et al. |
| 2019/0157341 | A1* | 5/2019 | Chang ................... H01L 27/156 |
| 2019/0206927 | A1* | 7/2019 | Lee ........................ H01L 33/08 |

FOREIGN PATENT DOCUMENTS

| CN | 109949709 A | 6/2019 |
| TW | 201242126 A1 | 10/2012 |

* cited by examiner

*Primary Examiner* — Daniel Luke
(74) *Attorney, Agent, or Firm* — ScienBiziP, P.C.

(57) ABSTRACT

A micro LED display panel which is transparent to ambient light includes a TFT substrate, a plurality of micro LEDs, a first insulating layer, and a second insulating layer. The TFT substrate includes a first surface and a second surface. The micro LEDs and the first insulating layer are on the first surface. The first insulating layer is transparent. The second insulating layer includes insulating units spaced from each other and made of a light absorbing material. Each insulating unit is on a side of the first insulating layer away from the TFT substrate and each micro LED is embedded in the first insulating layer and in one of insulating units. Regions of the TFT substrate not covered by the insulating layer are regions which allow light to pass through.

12 Claims, 7 Drawing Sheets

TRANSPARENT MICRO LED DISPLAY PANEL

FIELD

The subject matter herein generally relates to a micro light emitting diode (LED) display panel.

BACKGROUND

A conventional display panel comprises an opaque panel wherein light cannot pass from a back side to a front side thereof, so that an object behind the display panel cannot be seen from the front side of the display panel.

Therefore, there is room for improvement in the art.

BRIEF DESCRIPTION OF THE DRAWINGS

Implementations of the present technology will now be described, by way of embodiments only, with reference to the attached figures.

DETAILED DESCRIPTION

Figure 1:
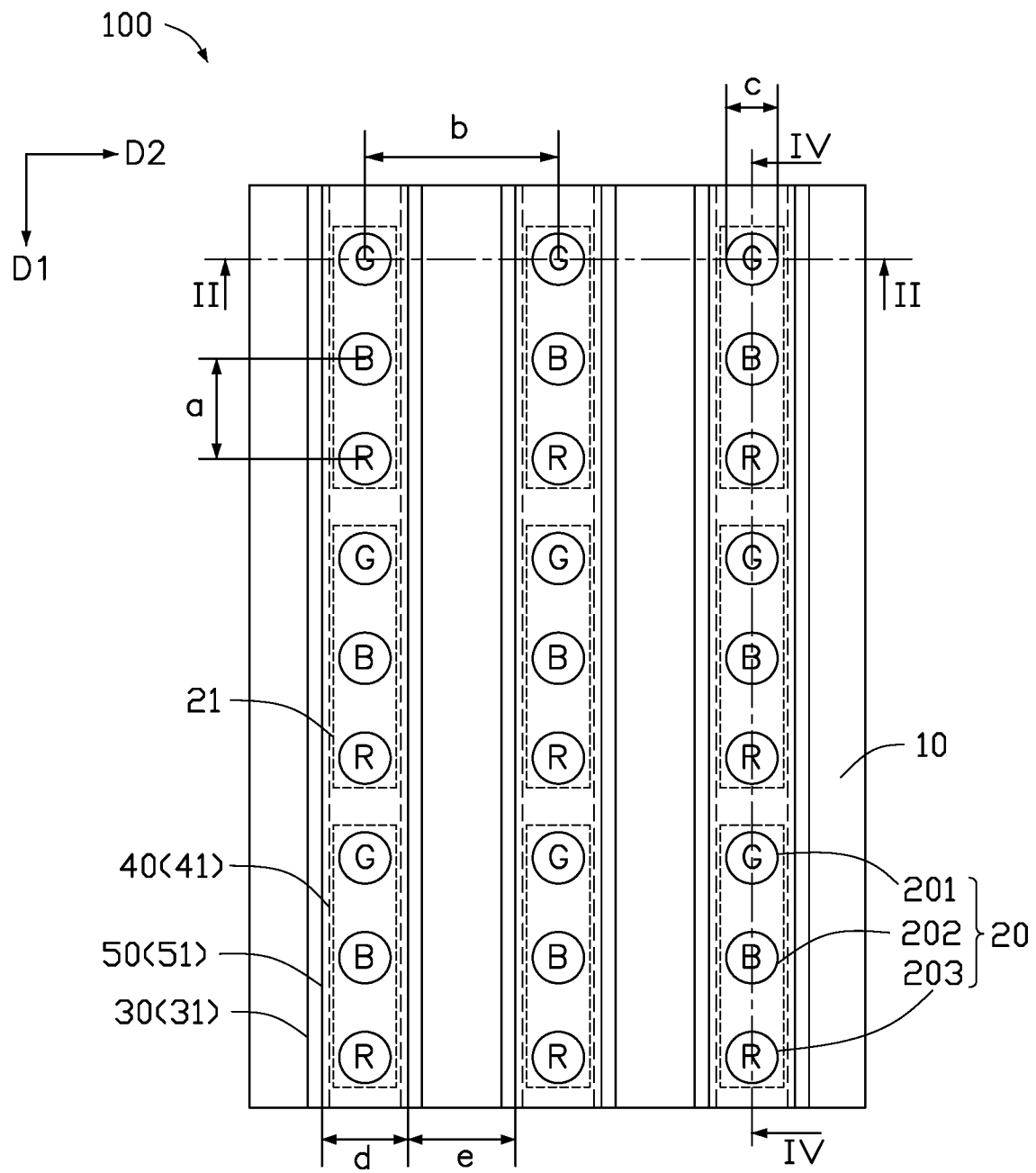
FIG. 1 is a planar view of a micro LED display panel of a first embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like. The term "micro LED" herein refers to an LED having a size of less than or equal to 100 micrometers (for example more than 10 micrometers and less than 100 micrometers).

First Embodiment

FIG. 1 illustrates a micro LED display panel 100. The micro LED display panel 100 includes a TFT substrate 10 and a plurality of micro LEDs 20 spaced apart from each other on the TFT substrate 10. The thin film transistor substrate 10 has a first surface 11 and a second surface 12 opposite to the first surface 11. The micro LEDs 20 are located on the first surface 11.

Figure 2:
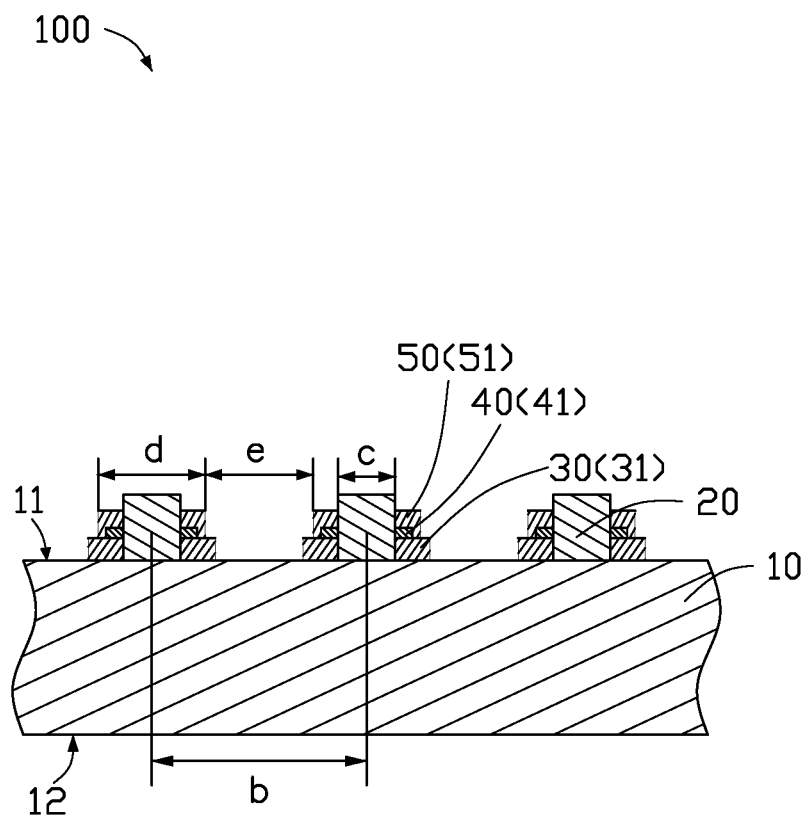
FIG. 2 is a cross-sectional view along line II-II of FIG. 1.

As shown in FIG. 1, the micro LEDs 20 are arranged in an array. FIG. 1 shows three columns of the micro LEDs 20 extending in a first direction D1. A number of columns of the micro LEDs 20 can be much greater than three. A total number of the micro LEDs 20 can be much greater than a number of the micro LEDs 20 shown in FIG. 1. As shown in FIG. 2, the micro LED display panel 100 further includes a first insulating layer 30 on a first surface 11 of the TFT substrate 10, a conductive layer 40 on the first insulating layer 30, and a second insulating layer 50 on the conductive layer 40. The conductive layer 40 is located between the first insulating layer 30 and the second insulating layer 50. The micro LEDs 20 are embedded in the second insulating layer 50 and the first insulating layer 30, but are not completely covered by the second insulating layer 50 and the first insulating layer 30. An end of each of the micro LEDs 20 away from the TFT substrate 10 is exposed from the second insulating layer 50.

As shown in FIG. 1 and FIG. 2, the first insulating layer 30, the conductive layer 40, and the second insulating layer 50 do not entirely cover the first surface 11 of the TFT substrate 10, but partially cover the first surface 11 of the TFT substrate 10. The first insulating layer 30 includes a plurality of first insulating units 31 spaced apart from each other; the conductive layer 40 includes a plurality of conductive units 41 spaced apart from each other; and the second insulating layer 50 includes a plurality of second insulating units 51 spaced apart from each other. Each of the second insulating units 51 is stacked on one of the first insulating units 31, and one of the conductive units 41 is located between one of the first insulating units 31 and one of the second insulating units 51. Thus, regions of the first surface 11 between every adjacent first insulating units 31 is a blank region.

Figure 4:
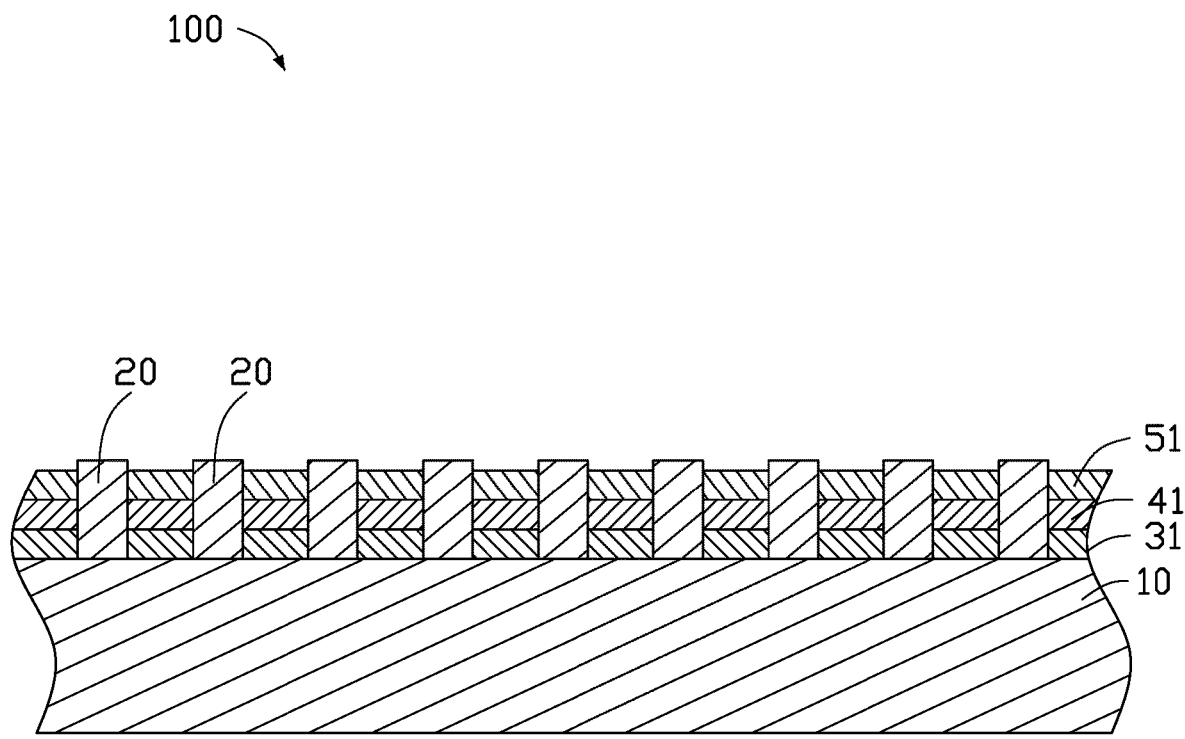
FIG. 4 is a cross-sectional view along line IV-IV of FIG. 1.

As shown in FIG. 1, each of the first insulating units 31, each of the conductive units 41, and each of the second insulating units 51 extend in a strip along the first direction D1 and correspond to a column of micro LEDs 20 along the first direction D1. As shown in FIG. 4, each column of micro LEDs 20 is embedded in one first insulating unit 31, one conductive unit 41, and one second insulating unit 51.

As shown in FIG. 1 and FIG. 2, a projection of each of the conductive units 41 on the TFT substrate 10 is within a projection of one second insulating unit 51 on the TFT substrate 10. A projection of each of the second insulating units 51 on the TFT substrate 10 is within a projection of one first insulating unit 31 on the TFT substrate 10.

A width d of each of the second insulating units 51 in a second direction D2 that is perpendicular to the first direction D1 is less than a width of one first insulating unit 31 in the second direction D2.

In one embodiment, the first insulating layer 30 is transparent and is made of conventional insulating material which is transparent. The second insulating layer 50 is made of a light-absorbing material used in the art, such as a black matrix resin. The second insulating layer 50 shields regions between adjacent micro LEDs 20, avoiding light leaking over to a micro LED 20 from an adjacent micro LED 20. In one embodiment, both the first insulating layer 30 and the second insulating layer 50 can be formed on the TFT substrate 10 by inkjet printing (IJP). In other embodiments, both the first insulating layer 30 and the second insulating layer 50 can be deposited on the TFT substrate 10 by process, such as chemical vapor deposition (CVD), IJP, or sputtering, and then patterned by photolithography.

Figure 3:
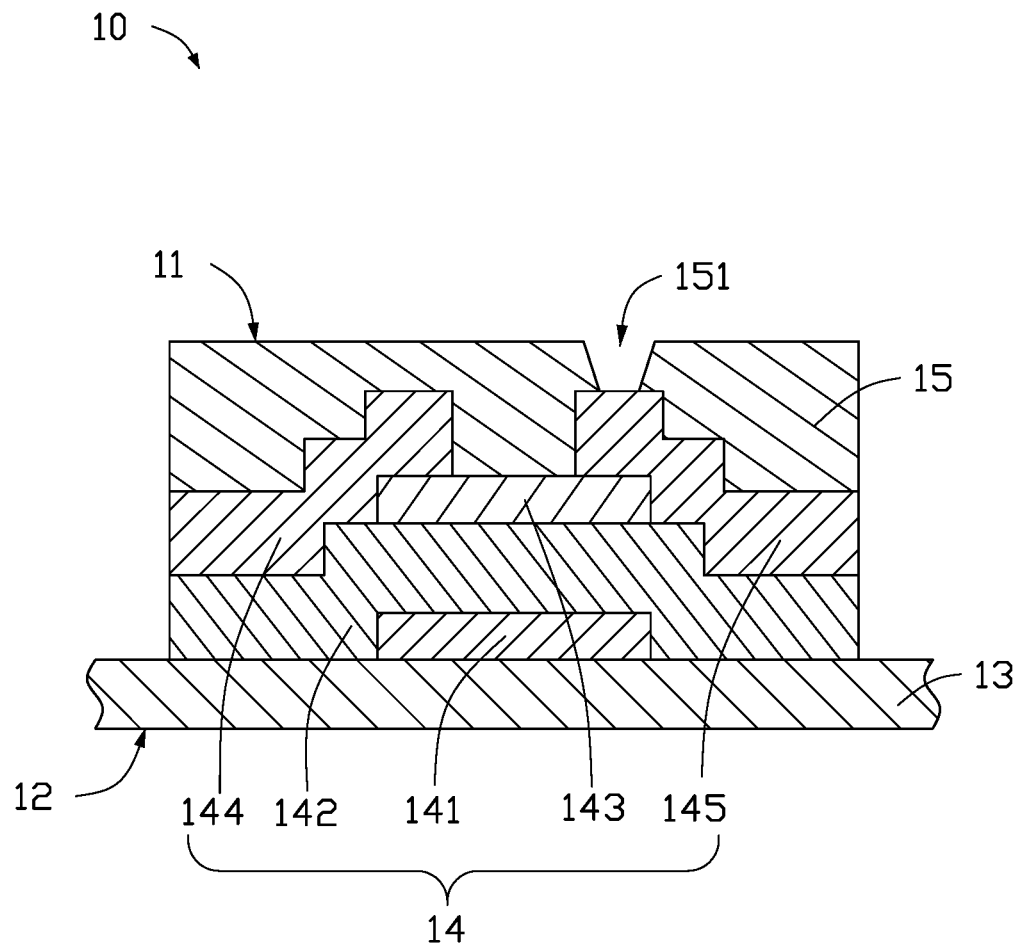
FIG. 3 is a cross-sectional view of a thin film transistor (TFT) substrate in the panel of FIG. 2.

As shown in FIG. 3, the TFT substrate 10 includes a transparent substrate 13, a plurality of TFTs 14 formed on the substrate 13, and a transparent planarization layer 15 covering a side of the TFTs 14 away from the substrate 13. FIG. 3 only shows one TFT 14. The first surface 11 is on a side of the TFTs 14 away from the substrate 13, and the second surface 12 is on a side of the substrate 13 without the TFTs 14.

In one embodiment, the TFT 14 can be a TFT that is substantially transparent and has a high transmittance in the visible light region. Specifically, the substrate 13 is made of transparent glass. The transparent TFT 14 includes a gate electrode 141 on the substrate 13, a gate insulating layer 142 on the gate electrode 141, a semiconductor layer 143 on the gate insulating layer 142, and a source electrode 144 and a drain electrode 145 on the semiconductor layer 143 and the gate insulating layer 142. The gate electrode 141, the source electrode 144 and the drain electrode 145 may be made of a transparent conductive material, for example, indium tin oxide (ITO), or carbon nanotubes, etc. The gate insulating layer may include $Al_2O_3$ and $TiO_2$. The semiconductor layer 143 may be made of an n-ZnO. The planarization layer 15 may be made of a material having good transparency, such as polymethyl methacrylate, polyimide, polyester, or the like.

Since the second insulating unit 51 is made of a light absorbing material, regions of the TFT substrate 10 that are covered by the second insulating unit 51 are regions through which light does not pass. In addition, since the first insulating unit 31 is transparent, other regions of the TFT substrate 10 not covered by the second insulating unit 51 are light-transmitting regions. As such, the regions of the TFT substrate 10 between adjacent second insulating units 51 is a transparent region (a light transmitting region), so that light from behind the micro LED display panel 100 can enter into the TFT substrate 10 from the second surface 12, pass through the TFT substrate, and be emitted from the first surface 11 not covered by the second insulating units 51.

In another embodiment, the TFTs 14 may also be located only in the regions of the substrate 13 covered by the second insulating units 51. The regions of the substrate 13 not covered by the second insulating units 51 have no TFTs. The TFT 14 can be non-transparent. As such, the regions of the TFT substrate 10 between adjacent second insulating units 51 is also a transparent region (a light-transmitting region), so that light from behind the micro LED display panel 100 enters into the TFT substrate 10 from the second surface 12, through the TFT substrate, and is emitted from the first surface 11 that is not covered by the second insulating units 51.

As shown in FIG. 1, a size of the area of the light-transmitting regions can be adjusted by adjusting the width d of each of the second insulating units 51 in the second direction D2 and the distance e between adjacent two second insulating units 51 in the second direction D2.

In one embodiment, a ratio of an area of light-transmitting regions to an area of the first surface 11 is not less than 3:10. For example, the ratio may be 3:10, 3.5:10, 4:10, 4.8:10, 5:10, or even more than 5:10. As shown in FIG. 1, in this embodiment, the width d is less than the distance e, so that less than 50% of a display area of the display panel 100 is occupied by the micro LEDs 20 and the second insulating units 51 (ie an opaque area), but more than 50% of the display area is transparent. That is, the ratio is not less than 50%. Therefore, in the micro LED display panel 100, light transmittance of 50% or more from the second surface 12 to the first surface 11 can be achieved.

As shown in FIG. 1 and FIG. 2, a shortest distance a between adjacent micro LEDs 20 in the first direction D1 is not more than 100 micrometers. The second insulating units 51 are parallel to each other and arranged in a row along the second direction D2. A shortest distance b between adjacent micro LEDs 20 embedded in adjacent second insulating units 51 is not more than 100 micrometers. A width c of each micro LED 20 is less than 10 micrometers.

Each micro LED 20 is a conventional micro LED. A first electrode (not shown) is located at an end of the micro LED 20 adjacent to the TFT substrate 10, and other end of the micro LED 20 is exposed from the second insulating layer 50 and covered with a second electrode (not shown). The first electrode of each micro LED 20 is electrically coupled to a TFT 14 on the TFT substrate 10 to obtain an anode voltage or a cathode voltage. In one embodiment, as shown in FIG. 3, the planarization layer 15 defines a through hole 151 to expose the TFT 14, and the first electrode of each micro LED 20 can be electrically coupled to the drain electrode 145 of one TFT 14 by the through hole 151. The second electrode of each micro LED 20 is electrically coupled to an external circuit supplying the anode voltage or the cathode voltage. When a voltage differential is formed between the first electrode and the second electrode, the micro LED 20 will emit light.

As shown in FIG. 1, each of the conductive units 41 surrounds at least one micro LED 20. The conductive unit 41 applies a voltage different from the anode voltage and the cathode voltage of the micro LED 20 to bias and limit the charge carriers inside the micro LED 20. In some embodiments, the conductive layer 40 may also be omitted.

As shown in FIG. 1, the micro LED display panel 100 defines pixel units 21. In the present embodiment, the pixel units 21 are arranged in a matrix. Each pixel unit 21 includes several micro LEDs 20 emitting light of different colors.

As shown in FIG. 1, each pixel unit 21 includes a green micro LED 201 emitting green light (shown as G in FIG. 1), a blue micro LED 202 emitting blue light (shown as B in FIG. 1), and a red micro LED 203 emitting red light (shown as R in FIG. 1). One green micro LED 201, one blue micro LED 202, and one red micro LED 203 in each pixel unit 21 are arranged in the first direction D1. The green micro LEDs 201 are arranged in a plurality of rows in the second direction D2. The blue micro LED 202 are arranged in a plurality of rows in the second direction D2. The red micro LED 203 are arranged in a plurality of rows in the second direction D2. The rows of green micro LEDs 201, the rows of blue micro LED 202, and the rows of red micro LED 203 are arranged so as to alternate along the first direction D1.

Figure 5:
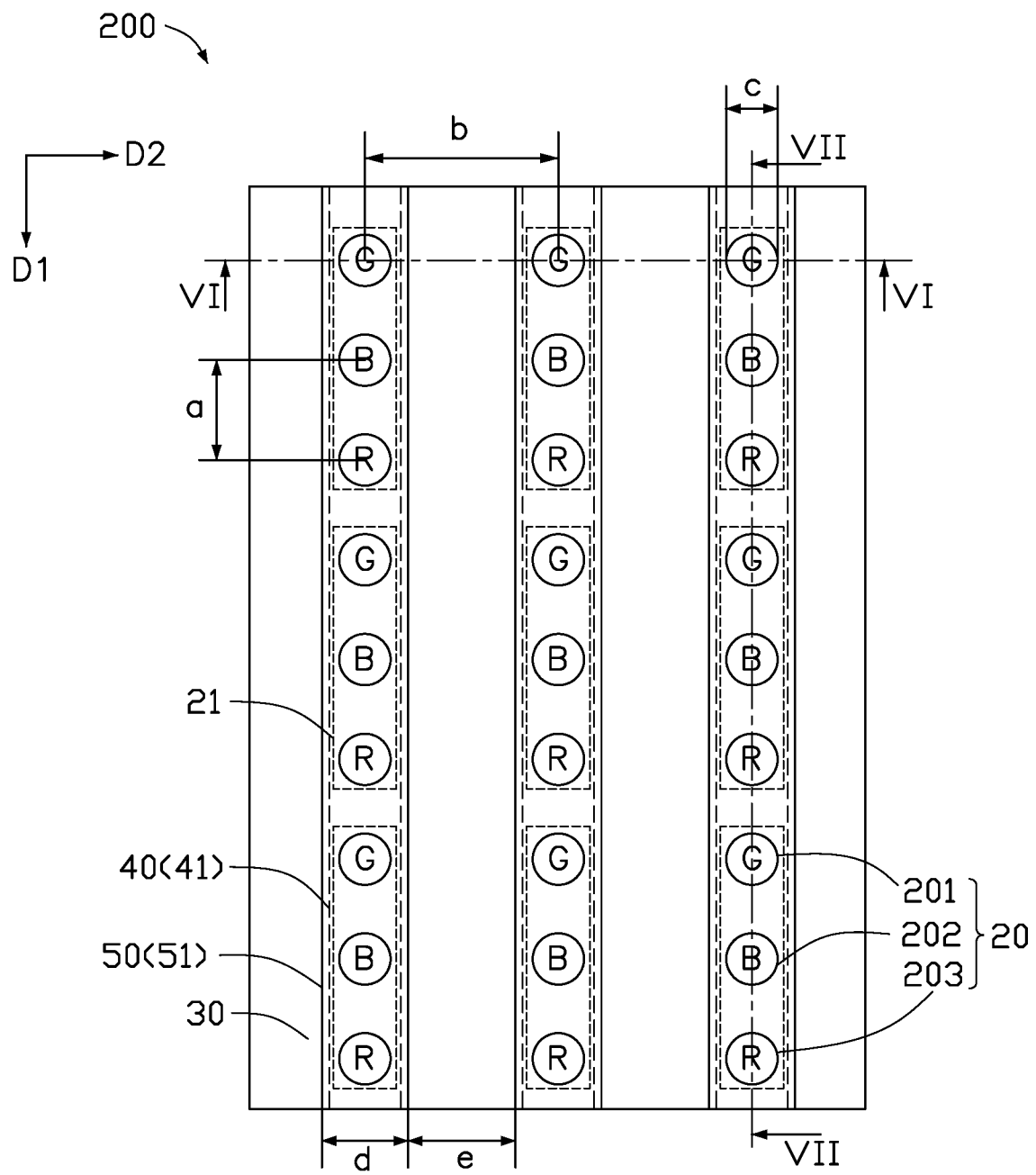
FIG. 5 is a planar view of a micro LED display panel of a second embodiment.
Figure 6:
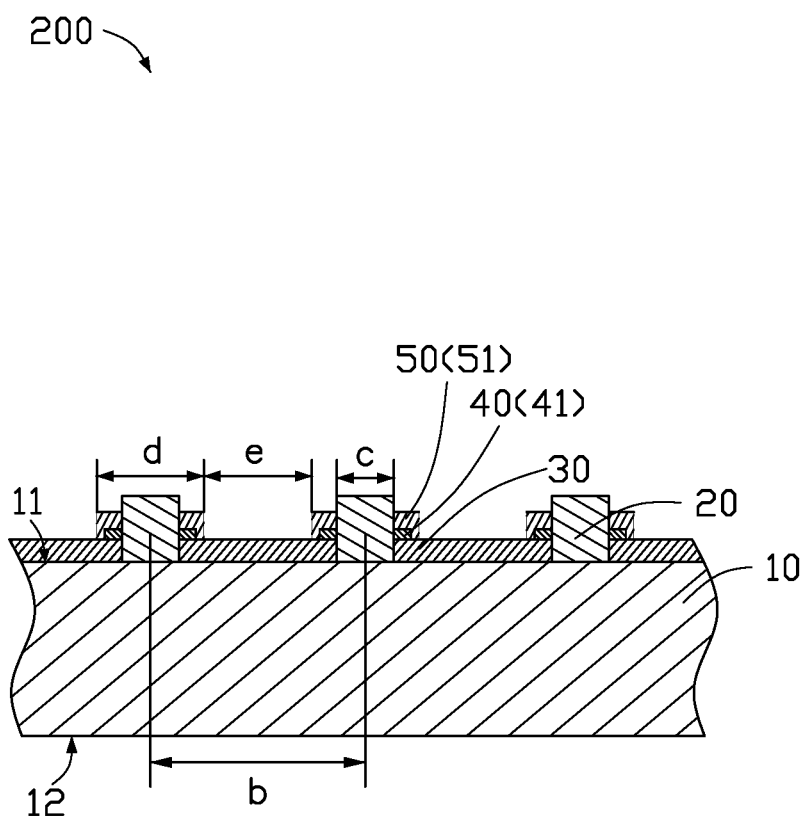
FIG. 6 is a cross-sectional view along line VI-VI of FIG. 5.
Figure 7:
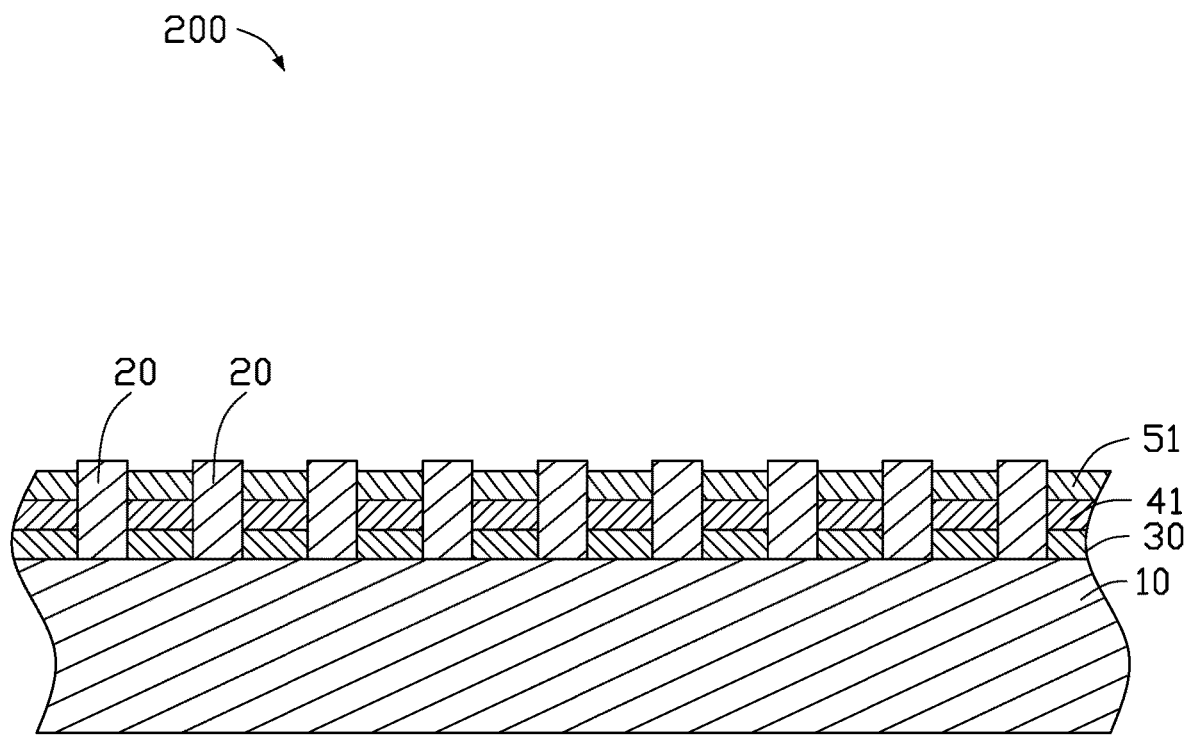
FIG. 7 is a cross-sectional view along line VII-VII of FIG. 5.

As shown in FIG. 5 to FIG. 7, the micro LED display panel 200 of the second embodiment of the present disclosure is different from the micro LED display panel 100 of the first embodiment. In the second embodiment, the first insulating layer 30 completely covers the first surface 11 of the TFT substrate 10, and the plurality of micro LEDs 20 are embedded in the first insulating layer 30 and the second insulating units 51. As such, a step of patterning the first insulating layer 30 to form the first insulating units 31 can be omitted.

The micro LED display panels 100, 200 can be applied in automotive head-up displays (HUDs) because they can withstand higher temperatures and provide better readability in direct sunlight.

The micro LED display panels 100, 200 can be used for digital signage, product displays, smart windows, head-up displays (HUDs), augmented reality (AR), and the like.

The light transmitting regions of the micro LED display panels 100, 200 can also receive solar cells or sensors embedded therein to measure temperature or parts per million of airborne particles.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A micro light emitting diode (LED) display panel, comprising:
    a thin film transistor (TFT) substrate, the TFT substrate comprising a first surface and a second surface opposite to the first surface; and
    a plurality of micro LEDs on the first surface; the plurality of micro LEDs being spaced apart from each other;
    a first insulating layer on the first surface, the first insulating layer is transparent; and
    a second insulating layer made of a light absorbing material, the second insulating layer comprising a plurality of insulating units spaced apart from each other and, each of the plurality of insulating units being on a side of the first insulating layer away from the TFT substrate;
    wherein each of the plurality of micro LEDs is embedded in the first insulating layer and one of the plurality of insulating units; the first insulating layer surrounds and is in direct contact with each of the plurality of micro LEDs; and a portion of the TFT substrate that is not covered by the second insulating layer forms light transmitting regions;
    the second insulating layer partially covers a surface of the first insulating layer away from the TFT substrate so that light from a side of the TFT substrate having the plurality of micro LEDs is transmitted.

2. The micro LED display panel of claim 1, wherein a ratio of an area of the light-transmitting regions to an area of the first surface is not less than 3:10.

3. The micro LED display panel of claim 1, wherein each of the plurality of insulating units extends to be a strip along a first direction.

4. The micro LED display panel of claim 3, wherein the plurality of insulating units are parallel to each other and arranged in a row extending along a second direction that is perpendicular to the first direction.

5. The micro LED display panel of claim 4, wherein a shortest distance b between every adjacent micro LEDs in adjacent two of the plurality of insulating units is no more than 100 micrometers.

6. The micro LED display panel of claim 1, wherein the first insulating layer is a continuous layer covering the first surface.

7. The micro LED display panel of claim 1, wherein the first insulating layer comprises a plurality of additional insulating units on the first surface; and the plurality of additional insulating units are spaced apart from each other.

8. The micro LED display panel of claim 7, wherein each of the plurality of additional insulating units extends to be a strip along a first direction; each of the plurality of insulating units is located on a side of one of the plurality of additional insulating units away from the TFT substrate.

9. The micro LED display panel of claim 8, wherein a projection of each of the insulating units on the TFT substrate is within a projection of one corresponding additional insulating unit on the TFT substrate.

10. The micro LED display panel of claim 1, further comprising a conductive layer between the first insulating layer and the second insulating layer, wherein the conductive layer comprises a plurality of conductive units spaced apart from each other, each of the plurality of conductive units is between the first insulating layer and one of the plurality of insulating units.

11. The micro LED display panel of claim 10, wherein each of the plurality of conductive units surrounds at least one of the plurality of micro LEDs.

12. The micro LED display panel of claim 1, wherein an end of each of the micro LEDs away from the TFT substrate is exposed from the second insulating layer.

* * * * *